United States Patent
Lim et al.

(10) Patent No.: US 11,782,085 B2
(45) Date of Patent: Oct. 10, 2023

(54) SEMICONDUCTOR TEST DEVICE AND SYSTEM AND TEST METHOD USING THE SAME

(71) Applicant: Samsung Electronics Co., Ltd., Suwon-si (KR)

(72) Inventors: Meehyun Lim, Seoul (KR); Sungyeol Kim, Yongin-si (KR); Hyungjung Yong, Seongnam-si (KR); Jinyeong Yun, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 461 days.

(21) Appl. No.: 16/924,971

(22) Filed: Jul. 9, 2020

(65) Prior Publication Data

US 2021/0156904 A1 May 27, 2021

(30) Foreign Application Priority Data

Nov. 26, 2019 (KR) .................. 10-2019-0153606

(51) Int. Cl.
*G01R 31/28* (2006.01)
*H01L 23/00* (2006.01)
*H01L 25/065* (2023.01)

(52) U.S. Cl.
CPC ..... *G01R 31/2803* (2013.01); *G01R 31/2815* (2013.01); *H01L 24/14* (2013.01); *H01L 25/0657* (2013.01)

(58) Field of Classification Search
None
See application file for complete search history.

(56) References Cited

U.S. PATENT DOCUMENTS

| 5,426,372 A | 6/1995 | Freve |
| 6,812,690 B2 | 11/2004 | De Jong et al. |
| 8,742,776 B2 * | 6/2014 | Chou ............... H01L 24/14 324/724 |
| 9,720,051 B2 | 8/2017 | Holm et al. |
| 10,175,294 B2 * | 1/2019 | Wu ............... G01R 31/2896 |
| 11,614,482 B1 * | 3/2023 | Tuncer ........... G01R 31/2896 324/762.02 |
| 2012/0206160 A1 * | 8/2012 | Wu ............... G01R 31/2884 324/756.07 |
| 2016/0027754 A1 * | 1/2016 | Katagiri ........... H01L 24/13 257/737 |
| 2016/0306007 A1 * | 10/2016 | Liu ............ G01R 31/318511 |
| 2017/0242062 A1 | 8/2017 | Corwin et al. |

(Continued)

FOREIGN PATENT DOCUMENTS

| CN | 111103529 A | 5/2020 |
| JP | 2924820 B2 | 5/1999 |

(Continued)

*Primary Examiner* — Jermele M Hollington
(74) *Attorney, Agent, or Firm* — Muir Patent Law, PLLC

(57) ABSTRACT

A test method for a semiconductor device includes determining a contact failure between a first semiconductor chip and a second semiconductor chip during assembly of a semiconductor package including the first semiconductor chip and the second semiconductor chip, using a test circuit embedded in the first semiconductor chip, and after the assembly of the semiconductor package, determining whether the semiconductor package is defective by using the test circuit.

15 Claims, 11 Drawing Sheets

(56) References Cited

U.S. PATENT DOCUMENTS

| | | | |
|---|---|---|---|
| 2019/0113565 A1 | 4/2019 | Kim et al. | |
| 2020/0132758 A1 | 4/2020 | Lim et al. | |
| 2020/0166563 A1 | 5/2020 | Lim et al. | |

FOREIGN PATENT DOCUMENTS

| | | | |
|---|---|---|---|
| JP | 2002-131365 A | 5/2002 | |
| JP | 2006-343103 A | 12/2006 | |
| JP | 4512264 B2 | 5/2010 | |
| JP | 2017-150911 A | 8/2017 | |
| KR | 10-1039049 B1 | 6/2011 | |
| KR | 10-2020-0048293 A | 5/2020 | |
| KR | 10-2020-0060912 A | 6/2020 | |

* cited by examiner

SEMICONDUCTOR TEST DEVICE AND SYSTEM AND TEST METHOD USING THE SAME

CROSS-REFERENCE TO RELATED APPLICATION(S)

This application claims the benefit of priority under 35 USC 119(a) of Korean Patent Application No. 10-2019-0153606 filed on Nov. 26, 2019 in the Korean Intellectual Property Office, the entire disclosure of which is incorporated herein by reference.

BACKGROUND

The present inventive concept relates to a semiconductor test device and a test method using the same.

To miniaturize and improve performance of electronic systems, a system in package (SIP) technology in which heterogeneous semiconductor chips are placed together in a single package may be used. For example, in an SIP, memory, processors, routing elements and the like may be co-located in one package.

In SIPs, wiring circuits may be augmented to secure signal bandwidth between heterogeneous semiconductor chips. In addition, SIPs may be miniaturized to significantly reduce a delay time caused by wiring circuits. For example, an SIP may include a microbump or a micro pad with a pitch and a diameter ranging from a few micrometers to tens of micrometers.

Following this trend, various methods for testing SIPs are being developed.

SUMMARY

An aspect of the present inventive concept is to provide a semiconductor test device in which an electrical signal is generated using a test circuit embedded in a semiconductor chip, and an electrical field signal on a wiring, generated by the electrical signal, is measured without physical contact with a bump or a pad.

According to an aspect of the present inventive concept, a method using a semiconductor test device for testing a semiconductor package including a semiconductor chip includes controlling a test circuit included in the semiconductor chip to cause emission of an electrical field from at least a set of microbumps among microbumps connected to the semiconductor package; using a sensor disposed above an upper surface of the microbumps and spaced apart therefrom by a predetermined interval, to detect the electrical field emitted from the one or more microbumps of the set of microbumps and to output a signal including information about an electrical field waveform; and using the signal output from the sensor by a signal processing device to determine whether the semiconductor package is defective. The set of microbumps are bumps for connecting the semiconductor package to an external package substrate.

According to an aspect of the present inventive concept, in a semiconductor test system including at least one semiconductor package and a wiring circuit board, the wiring circuit board including first upper pads and second upper pads, the semiconductor test system includes a circuit control device configured to control a test circuit included in a first semiconductor package among at least one semiconductor package to emit an electrical field from second upper pads of at least some of the second upper pads of the wiring circuit board, a sensor configured to be disposed above upper surfaces of the second upper pads to be spaced apart therefrom by a predetermined interval, to detect an electrical field emitted from the second upper pads and to output a signal including information on an electrical field waveform, and a signal processing device configured to determine whether the semiconductor device is defective, using the signal output from the sensor.

According to an aspect of the present inventive concept, a method for testing a semiconductor package including a first semiconductor chip and a second semiconductor chip stacked on the first semiconductor chip includes controlling a test circuit included in the first semiconductor chip to cause emission of an electrical field from at least some first upper pads among first upper pads of the second semiconductor chip; using a sensor disposed above upper surfaces of the first upper pads and spaced apart therefrom by a predetermined interval, detecting an electrical field emitted from the first upper pads, and outputting a signal including information on an electrical field waveform; and using a signal processing device to determine a contact failure between the first semiconductor chip and the second semiconductor chip, using the signal output from the sensor.

According to an aspect of the present inventive concept, a test method for a semiconductor device includes determining a contact failure between a first semiconductor chip and a second semiconductor chip during assembly of a semiconductor package including the first semiconductor chip and the second semiconductor chip, using a test circuit embedded in the first semiconductor chip, and after the assembly of the semiconductor package, determining whether the semiconductor package is defective by using the test circuit.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1:
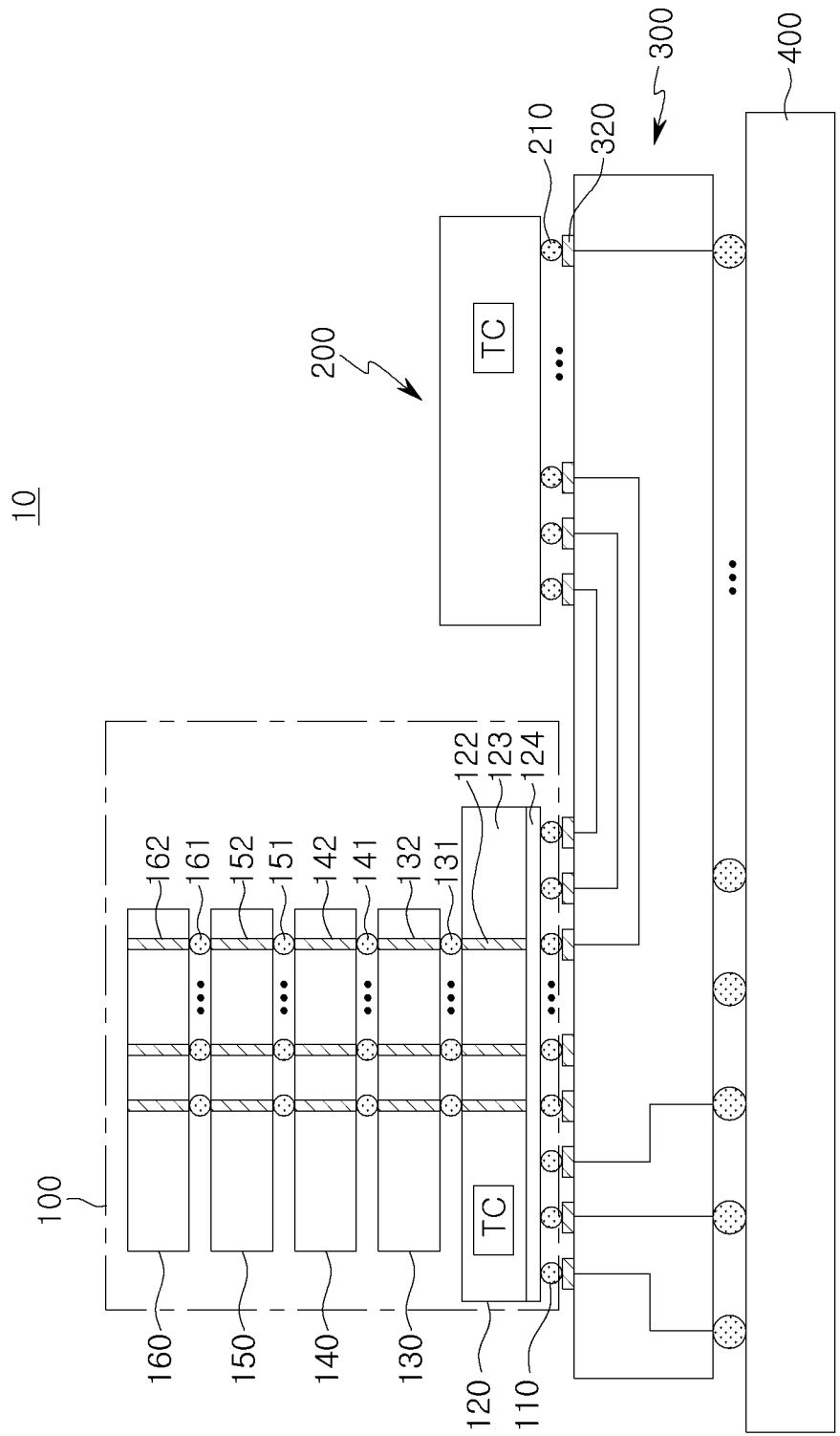
FIG. 1 is a cross-sectional view of a semiconductor device according to an example embodiment.

FIG. 1 is a cross-sectional view of a semiconductor device according to an example embodiment.

Referring to FIG. 1, a semiconductor device 10 may include a first semiconductor package 100, a second semiconductor package 200, a wiring circuit board 300, and a lower substrate 400. The semiconductor device 10 may be configured as a system-in-package in which heterogeneous semiconductor chips are assembled into a single package. In FIG. 1, each of the semiconductor chips assembled into one package in the semiconductor device 10 may correspond to a semiconductor package. Though not shown, the semiconductor device 10, which may be a semiconductor package, may be covered to include an encapsulating layer, or mold layer, formed thereon to cover the first semiconductor package 100, second semiconductor package 200, wiring circuit board 300, and lower substrate 400.

The first semiconductor package 100 may be a memory package. For example, the first semiconductor package 100 may be a high bandwidth memory (HBM) package. The first semiconductor package 100 may include a plurality of microbumps 110, a base die 120, and memory dies 130-160. Each of the base die 120 and the memory dies 130-160 may be a semiconductor chip, for example, formed from a semiconductor substrate to have an integrated circuit formed thereon.

The base die 120 may be disposed in a lowermost portion of the first semiconductor package 100. For example, the first memory die 130 may be stacked on the base die 120, and a second memory die 140 may be stacked on the first memory die 130. A third memory die 150 may be stacked on the second memory die 140, and a fourth memory die 160 may be stacked on the third memory die 150. The stacked memory dies 130-160 may be positioned above the base die 120 (e.g., to overlap from a top-down view).

The base die 120 may include a plurality of through-substrate vias (TSVs) 122, which may be through-silicon vias, a circuit region 123, a wiring layer 124, and a test circuit TC. The circuit region 123 may be a region including a wafer and circuits provided by elements formed on the wafer. Some of the circuits may constitute the test circuit TC. The circuit region 123 may be formed of silicon or the like.

The plurality of TSVs 122 may penetrate through the base die 120. Through the plurality of TSVs 122, the first memory die 130 may be stacked on the base die 120. The base die 120 may be electrically connected to the first memory die 130 through the plurality of TSVs 122. A first plurality of microbumps 131 may be disposed between the base die 120 and the first memory die 130. Each of the first plurality of microbumps 131 may include nickel (Ni), copper (Cu), tin (Sn), lead (Pb), or the like. Each of the plurality of first microbumps 131 may be formed to have a hemisphere or a convex shape. Each of the plurality of first microbumps 131 may have a size of several micrometers or several tens of micrometers. Microbumps 110 may have the same or similar shape and size and be formed of the same or similar materials as the plurality of first microbumps 131.

The first memory die 130 may include a plurality of first TSVs 132. The plurality of first TSVs 132 may penetrate through the first memory die 130. Through the plurality of first TSVs 132, the second memory die 140 may be stacked on the first memory die 130. The first memory die 130 may be electrically connected to the second memory die 140 through the plurality of first TSVs 132. Through stacking of memory dies, the total capacity of the first semiconductor package 100 may increase. A plurality of second microbumps 141 may be disposed between the first memory die 130 and the second memory die 140. The plurality of second microbumps 141 may have the same or similar configuration as that of the plurality of first microbumps 131.

The second memory die 140 may include a plurality of second TSVs 142. The plurality of second TSVs 142 may penetrate through the second memory die 140. Through the plurality of second TSVs 142, the third memory die 150 may be stacked on the second memory die 140. The second memory die 140 may be electrically connected to the third memory die 150 through the plurality of second TSVs 142. Through stacking of memory dies, the total capacity of the first semiconductor package 100 may increase. A plurality of third microbumps 151 may be disposed between the second memory die 140 and the third memory die 150. The plurality of third microbumps 151 may have the same or similar configuration as the plurality of first microbumps 131.

The third memory die 150 may include a plurality of third TSVs 152. The plurality of third TSVs 152 may penetrate through the third memory die 150. The fourth memory die 160 may be stacked on the third memory die 150 through the plurality of third TSVs 152. The third memory die 150 may be electrically connected to the fourth memory die 160 through the plurality of third TSVs 152. Through stacking of memory dies, the total capacity of the first semiconductor package 100 may increase. A plurality of fourth microbumps 161 may be disposed between the third memory die 150 and the fourth memory die 160. The plurality of fourth microbumps 161 may have the same or similar configuration as the plurality of first microbumps 131.

The fourth memory die 160 may include a plurality of fourth TSVs 162. The plurality of fourth TSVs 162 may penetrate through the fourth memory die 160. Although not illustrated, a plurality of memory dies may be further stacked on the fourth memory die 160 through the plurality of fourth TSVs 162. The fourth memory die 160 may be electrically connected to the plurality of memory dies through the plurality of fourth TSVs 162. Through stacking of memory dies, the total capacity of the first semiconductor package 100 may increase.

For example, the base die 120 and the plurality of memory dies 130-160 may be electrically connected to each other through microbumps 131, 141, 151 and 161, through-electrodes 122, 132, 142, 152 and 162, and an internal wiring circuit.

The first semiconductor package 100 may be stacked on the wiring circuit board 300. For example, the first semiconductor package 100 may be stacked on the wiring circuit board 300 by combining the microbumps 110 of the first semiconductor package 100 and upper pads 320 of the wiring circuit board 300. For example, the first semiconductor package 100 may be electrically connected to the wiring circuit board 300.

The first semiconductor package 100 may be stacked on the lower substrate 400 via the wiring circuit board 300. The wiring circuit board 300 may electrically connect the first semiconductor package 100 to the lower substrate 400. The lower substrate 400 may be a printed circuit board (PCB) having a circuit pattern.

The second semiconductor package 200 may include a processor. For example, the second semiconductor package 200 may be an application-specific integrated circuit (ASIC). The second semiconductor package 200 may be stacked on the wiring circuit board 300. For example, the second semiconductor package 100 may be stacked on the wiring circuit board 300 by combining the microbumps 210 of the second semiconductor package 100 and the upper pads 320 of the wiring circuit board 300. The second semiconductor package 200 may be stacked on the lower substrate 400 via the wiring circuit board 300. The wiring circuit board 300 may electrically connect the second semiconductor package 200 to the lower substrate 400.

In a typical semiconductor device, the test may be performed only for a component that can be contacted through a probe or the like at an individual die level or an individual semiconductor chip level before assembling heterogeneous semiconductor chips (or heterogeneous semiconductor packages) into one package. Components that are difficult to contact through a probe or the like may be tested after heterogeneous semiconductor chips are assembled into one package. However, after the heterogeneous semiconductor chips are assembled into one package, if one just one chip is found to be defective, even the other normal, non-defective components should be discarded due to defective components generated by the test.

The semiconductor device 10 according to an example embodiment may include part of a semiconductor test device. The semiconductor test device may test the first semiconductor package 100 without physical contact of bumps or pads using the test circuit TC included in the first semiconductor package 100. The test circuit TC may be activated by a control signal input from an external source. Both the test circuit TC and the external source may be considered part of the semiconductor test device. Also, the semiconductor test device combined with the semiconductor device 10 may be described as a semiconductor system. The semiconductor test device may test whether the first semiconductor package 100 is defective without physical contact of bumps or pads for each die included in the first semiconductor package 100 during assembly of the first semiconductor package 100. In addition, the semiconductor test device may test whether the first semiconductor package 100 is defective after the assembly of the first semiconductor package 100 without physical contact of bumps or pads of the first semiconductor package 100.

Therefore, the defective components included in the semiconductor package may be detected early, thereby reducing costs. In addition, since the contact traces remaining on the bumps or the pads by the probe or the like during the assembly of the semiconductor package increase the possibility of defective components, a component that is difficult to contact may be tested.

Figure 2:
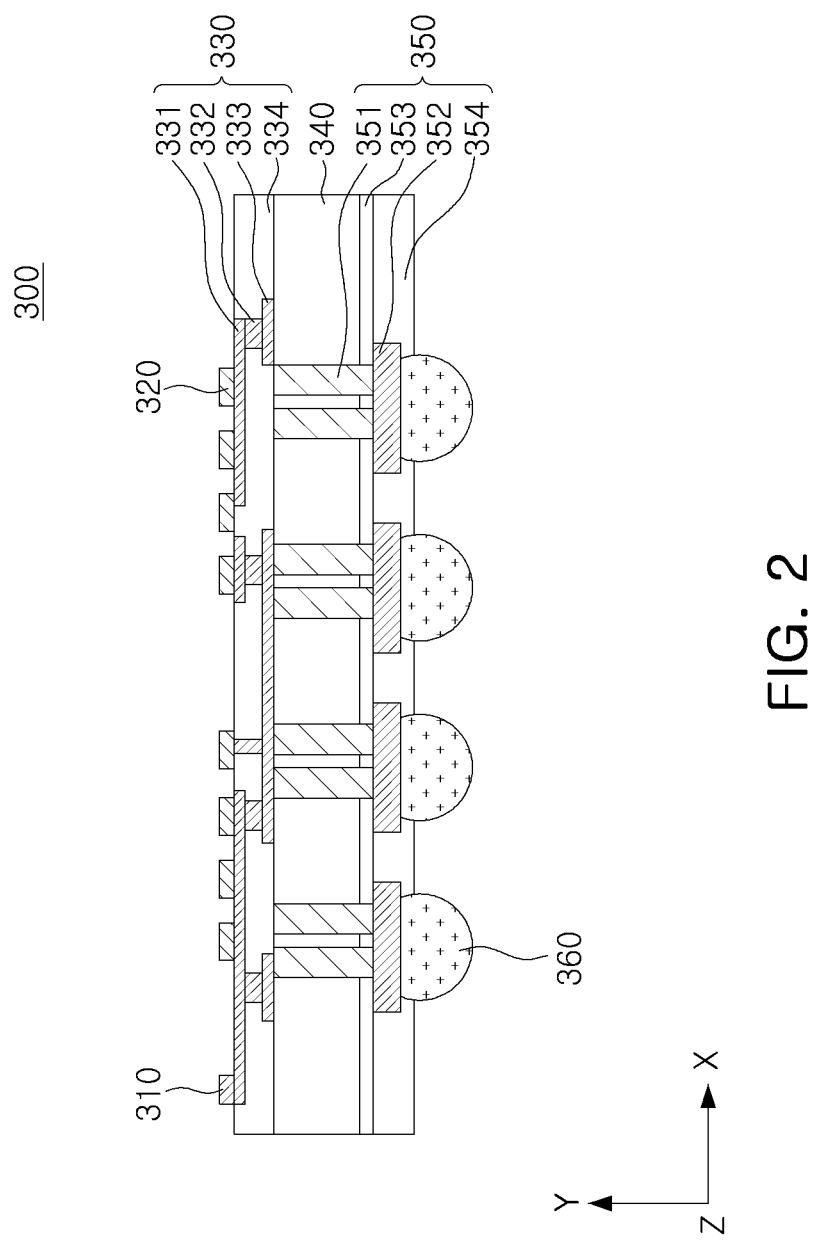
FIG. 2 is a cross-sectional view of a wiring circuit board according to an example embodiment.

FIG. 2 is a cross-sectional view of a wiring circuit board according to an example embodiment.

Referring to FIG. 2, the wiring circuit board 300 may include a test pad 310, upper pads 320, an upper wiring layer 330, a substrate 340, a lower wiring layer 350, and connection terminals 360.

The substrate 340 may be formed of any one of silicon, an organic material, plastic, and a glass substrate. The substrate 340 may have a single layer or a multilayer structure. The wiring circuit board 300 may also be referred to as a silicon interposer when the substrate 340 is a silicon substrate.

The test pad 310 may be disposed on an upper surface of the substrate 340. The test pad 310 may be used to determine whether the wiring circuit board 300 is defective in a first direction (e.g., an X direction) parallel to the substrate 340. For example, if connection elements that extend in the X direction become disconnected from or have weaker connections to other conductive elements they are supposed to be connected to, or become connected (e.g., shorted) to other conductive elements they are not supposed to be connected to, the wiring circuit board 300 may be defective in the first direction. The test pad 310 may be used to determine that a wiring circuit is defective inside the wiring circuit board 300.

In addition, the test pad 310 may transmit a control signal input from an external source (e.g., a source external to the first semiconductor package 100 or semiconductor device 10) to the test circuit included in the semiconductor package when the semiconductor package is stacked on the wiring circuit board 300 during the assembly of the semiconductor device. The test circuit may be used to determine a poor contact between the wiring circuit board 300 and the semiconductor package (e.g., first semiconductor package 100). For example, when the first semiconductor package 100 is stacked on the wiring circuit board 300, the test pad 310 may be used to determine whether the first semiconductor device 100 is defective in a second direction (for example, a Y direction) perpendicular to the substrate 340. For example, if connection elements that extend or connect to other conductive elements in the Y direction become disconnected from or have weaker connections to the other conductive elements they are supposed to connected to, or become connected (e.g., shorted) to other conductive elements they are not supposed to be connected to, the wiring circuit board 300 may be defective in the second direction.

In this specification, poor contact may mean that the bump and the pad are electrically open or have a relatively high resistance value between the bump and the pad due to a defect in a pad, a defect in a bump, dust between the pad and the bump, oxidation of the pad, misalignment between the pad and the bump, or the like. In addition, poor contact may include poor contact between the pad and the via.

The upper pads 320 may be disposed on an upper surface of the substrate 340. When the semiconductor package is stacked on the wiring circuit board 300, the upper pads 320 may be electrically connected to the microbumps of the semiconductor package.

The upper wiring layer 330 may be electrically connected to the test pad 310 and the upper pads 320. The upper wiring layer 330 may have a single layer or a multilayer wiring structure. The upper wiring layer 330 may include a first metal pattern 331, a second metal pattern 333, a via 332, and a passivation layer 334. The first metal pattern 331, the second metal pattern 333, and the via 332 may be covered and/or surrounded by the passivation layer 334. The passivation layer 334 may be formed of an oxide or nitride such as $SiO_2$ or SiN.

The first metal pattern 331 and the second metal pattern 333 may transmit signals in a first direction (e.g., an X direction) parallel to the substrate 340 in different layers.

The via 332 may be connected between the first metal pattern 331 and the second metal pattern 333. The via 332, which may be formed of metal or other conductive material, may connect the first metal pattern 331 and the second metal pattern 333 in a second direction (e.g., a Y direction) perpendicular to the substrate 340. The via 332 may transmit a signal in the second direction.

The lower wiring layer 350 may include through-electrodes 351, lower pads 352, a first passivation layer 353, and a second passivation layer 354. The first passivation layer 353 and the second passivation layer 354 may be sequentially stacked on a lower surface of the substrate 340.

The through-electrodes 351 may penetrate through at least a portion of the substrate 340 to connect the lower pads 352 and the upper wiring layer 330. When the substrate 340 is silicon, the through-electrode 351 may be a through-silicon via (TSV).

The connection terminals 360 may be disposed on the lower surface of the substrate 340. The connection terminals 360 may be electrically connected to the lower wiring layer 350. For example, the connection terminals 360 may be electrically connected to the through-electrodes 351 through the lower pads 352. The connection terminals 360 may be electrically connected to the upper pads 320 through the upper wiring layer 330 and the lower wiring layer 350. The various pads of a device described herein may be conductive terminals connected to internal wiring of the device, and may transmit signals and/or supply voltages between an internal wiring and/or internal circuit of the device and an external source. For example, chip pads of a semiconductor chip may electrically connect to and transmit supply voltages and/or signals between an integrated circuit of the semiconductor chip and a device to which the semiconductor chip is connected. The various pads may be provided on or near an external surface of the device and may generally have a planar surface area (often larger than a corresponding surface area of the internal wiring to which they are connected) to promote connection to a further terminal, such as a bump or solder ball, and/or an external wiring.

The connection terminals 360 may be used when the wiring circuit board 300 is stacked on a printed circuit board (PCB) or the like. The connection terminals 360 may be bumps, solder balls, or the like based on the shape or material thereof.

Figure 3:
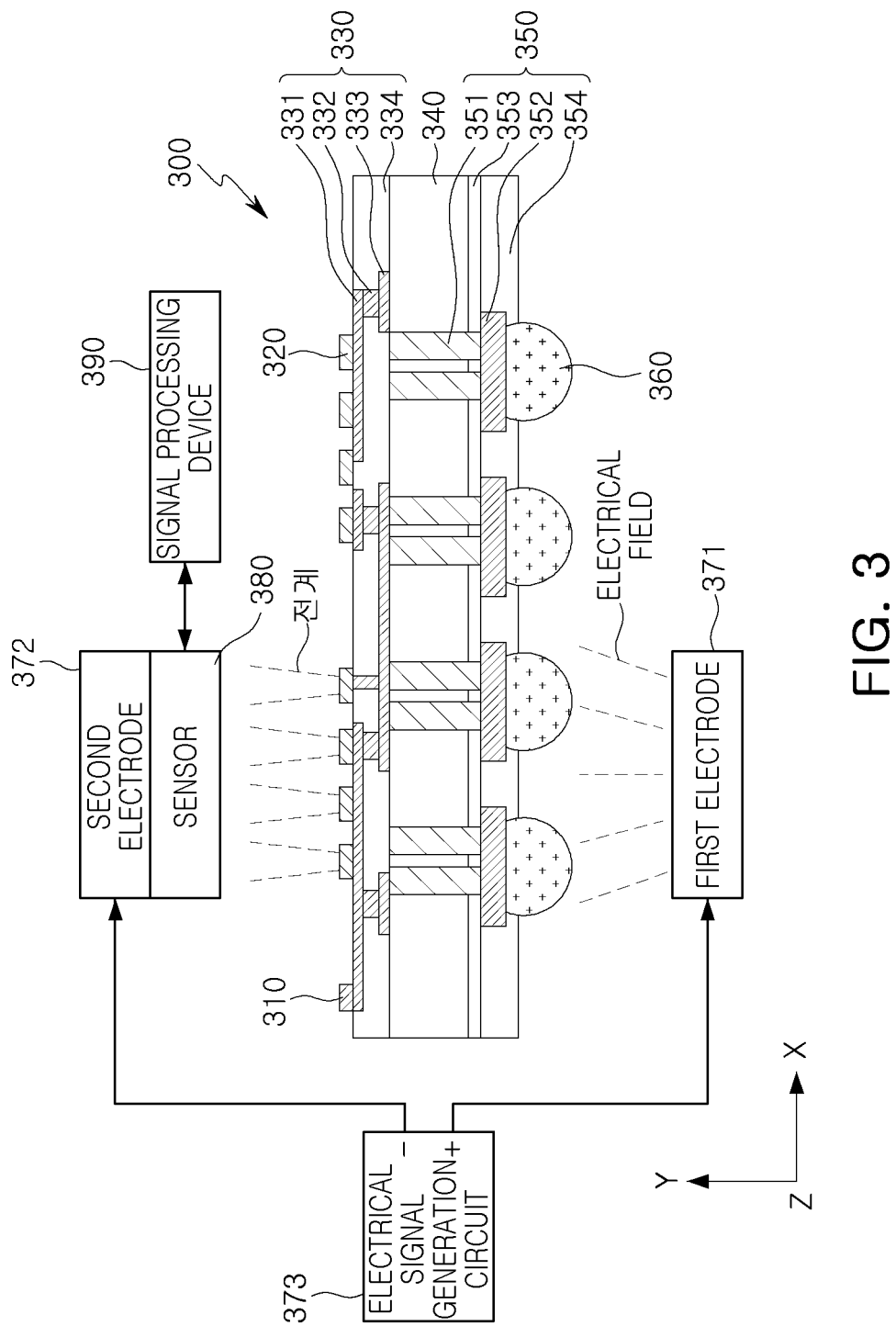
FIG. 3 is a diagram illustrating an operation of testing a wiring circuit board by a semiconductor test device according to an example embodiment.

FIG. 3 is a diagram illustrating an operation of testing a wiring circuit board by a semiconductor test device according to an example embodiment.

Referring to FIG. 3, the semiconductor test device may include a first electrode 371, a second electrode 372, an electrical signal generation circuit 373, a sensor 380, and a signal processing device 390. The semiconductor test device may determine whether the wiring circuit board 300 is defective by using an electrical field without physical contact of pads. The semiconductor test device may determine, for example, whether the wiring circuit board 300 is defective in a first direction (e.g., the X direction) parallel to the substrate 340.

The electrical signal generation circuit 373 may generate an electrical signal for generating an electrical field. For example, the electrical signal generation circuit 373 may include an oscillator, a phase locked loop (PLL) circuit, a digital to analog converter (DAC), and the like. The electrical signal generation circuit 373 may generate an electrical signal and apply the electrical signal to the wiring circuit board 300 through the first electrode 371 and the second electrode 372. When the electrical signal generation circuit 373 applies the electrical signal to the wiring circuit board 300, a potential difference may occur between the first electrode 371 and the second electrode 372. Electrical fields may be emitted from the upper pads 320 of the wiring circuit board 300 by the potential difference.

The first electrode 371 and the second electrode 372 may be electrically connected to the electrical signal generation circuit 373. The first electrode 371 and the second electrode 372 may be formed of a metal having good electrical conductivity. The first electrode 371 and the second electrode 372 may have a flat plate shape. An electrode on the side detecting an electrical field, which may be either of the first electrode 371 and the second electrode 372, may be formed of a transparent electrode such as an indium tin oxide (ITO) electrode.

In an example embodiment, the first electrode 371 may be disposed below the wiring circuit board 300. The first electrode 371 may be spaced apart from the lower surface of the connection terminal 360 by a predetermined interval. The second electrode 372 may be disposed above the wiring circuit board 300. The second electrode 372 may be disposed above the upper surfaces of the upper pads 320 at predetermined intervals.

The first electrode 371 may be connected to a positive terminal (+) of the electrical signal generation circuit 373, and the second electrode 372 may be connected to a negative terminal (−) of the electrical signal generation circuit 373. Thus, the direction of the electrical field may be directed from the first electrode 371 to the second electrode 372.

The sensor 380 may be disposed between one of the first electrode 371 and the second electrode 372 and the wiring circuit board 300. For example, the sensor 380 may be disposed below the electrode on the side of detecting the electrical field, for example, disposed below the second electrode 372. For example, the sensor 380 may be spaced apart from a lower surface of the second electrode 372 by a predetermined interval. The sensor 380 may detect an electrical field emitted from the wiring circuit board 300.

According to an example embodiment, the sensor 380 may be a sensor using a current meter or a sensor using an electro-optical crystal, but an example embodiment thereof is not limited thereto. For example, any type of sensor capable of effectively detecting an electrical field may be applied to the semiconductor test device according to an example embodiment.

For example, when the sensor 380 is a sensor using a current meter, the sensor 380 may receive an electrical field by using an antenna disposed below the current meter, and may measure the current with respect to the electrical field received by the current meter to detect the electrical field.

According to an example embodiment, when the sensor 380 is a sensor using an electro-optic crystal, the sensor 380 may be configured to detect the electrical field by using characteristics in which the refractive index changes or the direction of the crystal changes according to the waveform of the electrical field.

The sensor 380 may be configured to detect an electrical signal such as a current or an optical signal such as light. The detected electrical signal or the detected optical signal may include information about the electrical field waveform. The sensor 380 may be configured to output the detected electrical signal or the detected optical signal. The information on the electrical field waveform may include magnitude information of the electrical field and phase information of the electrical field.

According to certain embodiments, the signal processing device 390 is configured to obtain electrical field data from which noise is removed by filtering the signal output from the sensor 140. According to some embodiments, the signal processing device 390 is configured to calculate electrical field waveforms at respective positions for each upper pad 320 by applying a mathematical operation to the electrical field data. For example, the signal processing device 390 may include hardware and/or software components configured to receive the electrical field data and perform the above calculations. The signal processing device 390 may be configured to determine a position of the upper pad determined to be defective by using the electrical field waveform for each position and the design data of the wiring circuit board 300. The semiconductor test device may be configured to determine whether the wiring circuit board 300 is defective based on whether at least one of the upper pads 320 of the wiring circuit board 300 is defective.

Figure 4:
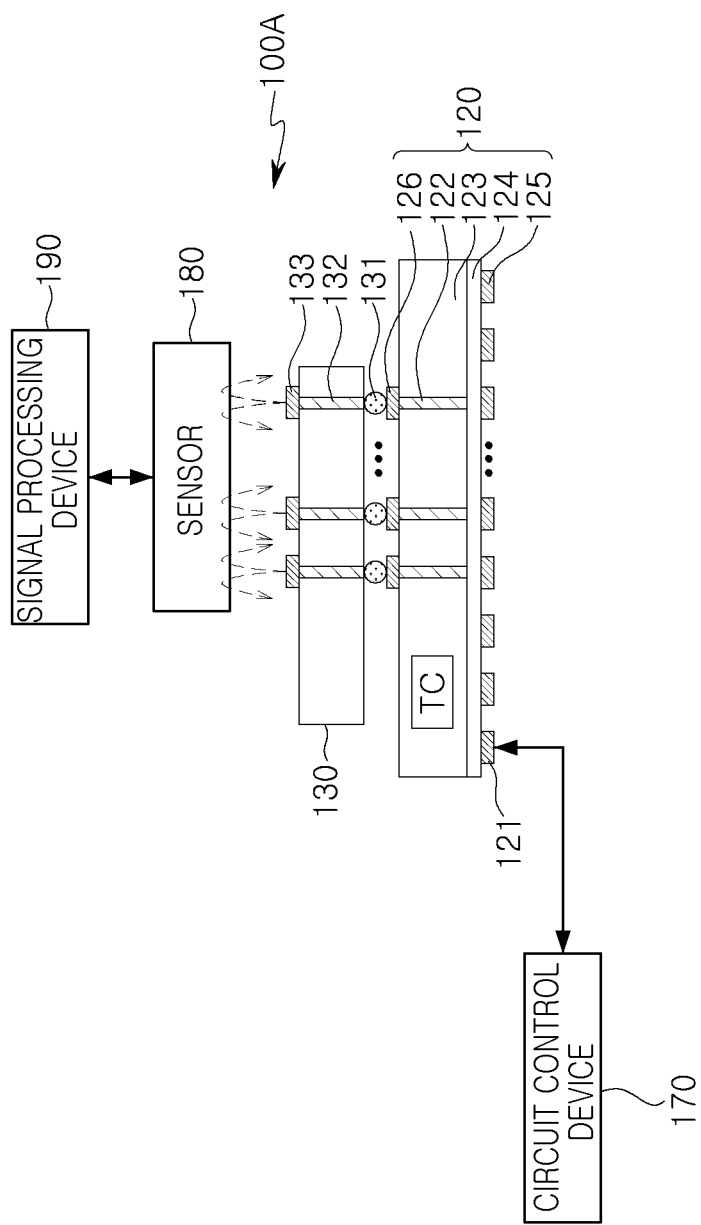
FIGS. 4 to 6 are diagrams illustrating an operation of testing a semiconductor package by a semiconductor test device according to an example embodiment.
Figure 5:
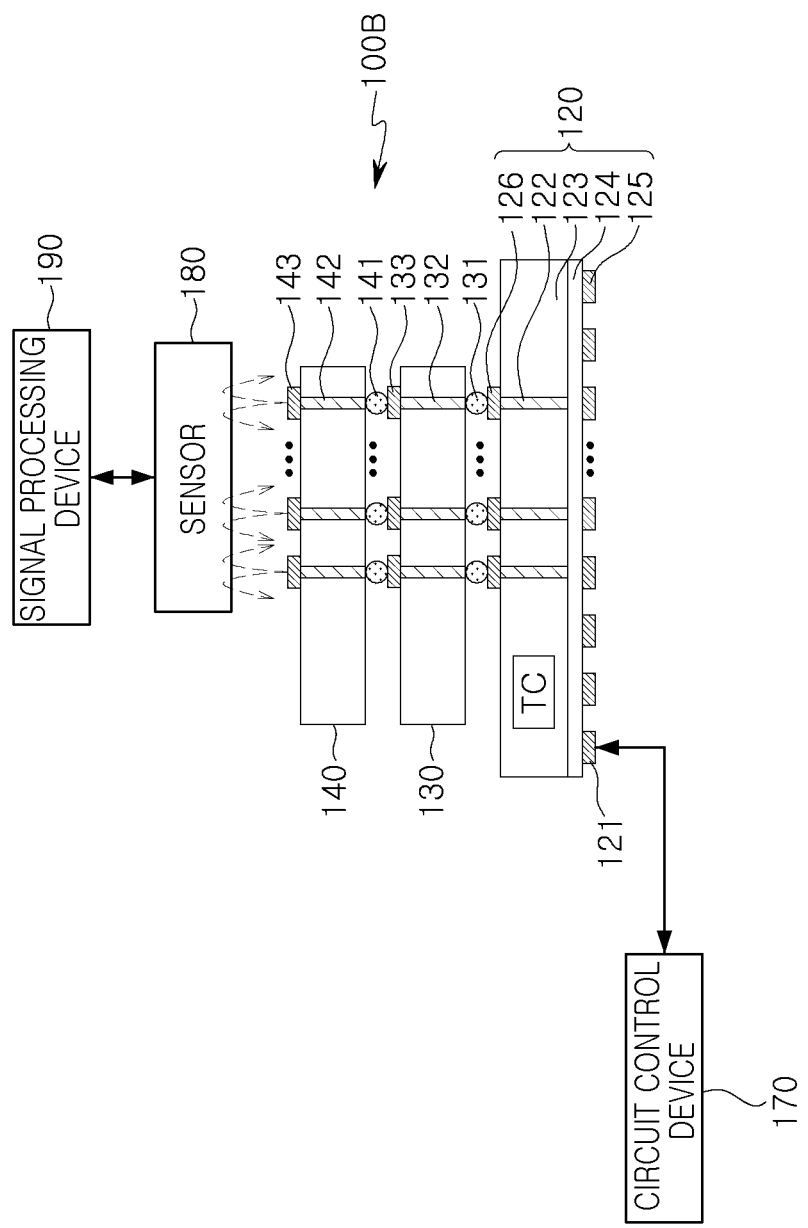
Figure 6:
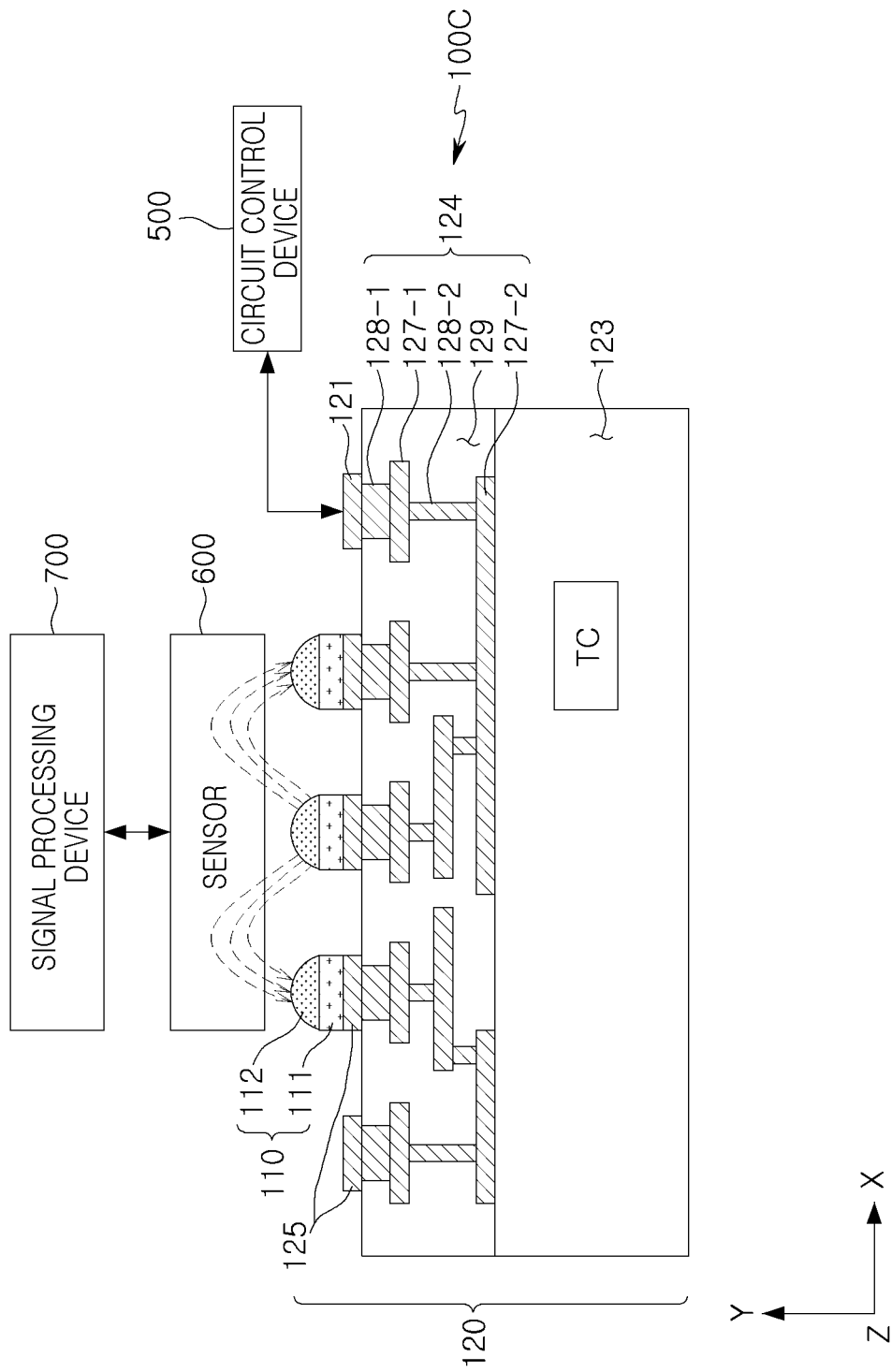

FIGS. 4 to 6 are diagrams illustrating an operation of testing a semiconductor package by a semiconductor test device according to an example embodiment.

FIGS. 4 and 5 are drawings illustrating the operation of determining whether or not a semiconductor package 100A or 100B is defective without physical contact of pads (e.g., data pads for transferring data or power pads or ground pads for supplying voltage) for each die included in the semiconductor package 100A and 100B during assembly of the semiconductor package 100A or 100B. FIG. 6 is a diagram illustrating an operation of determining whether a semiconductor package 100C is defective by a semiconductor test device after assembling the semiconductor package 100C without physical contact of pads of the semiconductor package 100C.

First, referring to FIG. 4, the semiconductor test device may include a circuit control device 170, a sensor 180, and a signal processing device 190. The structure and operation of the sensor 180 and the signal processing device 190 of FIG. 4 may be the same as or similar to the structure and operation of the sensor 380 and the signal processing device 390 of FIG. 3.

A base die 120 may include a test pad 121, a plurality of TSVs 122, a circuit region 123, a wiring layer 124, lower pads 125, upper pads 126, and a test circuit (TC). The test circuit TC may be considered to be part of the semiconductor test device. A first memory die 130 may include first microbumps 131, a plurality of first TSVs 132, and upper pads 133.

Through the coupling of the upper pads 126 of the base die 120 and the first microbumps 131 of the first memory die 130, the first memory die 130 is stacked on the base die 120. Through the plurality of TSVs 122 of the base die 120 and the plurality of first TSVs 132 of the first memory die 130, the base die 120 may be electrically connected to the upper pads of the first memory die 130.

Poor contact between the upper pads 126 of the base die 120 and the first microbumps 131 of the first memory die 130 may occur when the first memory die 130 is stacked on the base die 120. The semiconductor test device may determine contact failure between the upper pads 126 of the base die 120 and the first microbumps 131 of the first memory die 130. Accordingly, the semiconductor test device may determine whether the semiconductor package 100A is defective without physical contact of the upper pads 133 of the first memory die 130 during assembly of the semiconductor package 100A.

In detail, the sensor 180 may be disposed above the first memory die 130. For example, the sensor 180 may be disposed above the upper surfaces of the upper pads 133 of the first memory die 130 to be spaced apart therefrom by a predetermined interval.

The circuit control device 170 may transmit a control signal to the test circuit TC through the test pad 121, which may be physically connected to the circuit control device 170 (e.g., via a conductive wiring at an interface connected to the circuit control device 170). The test circuit TC may be activated by the control signal. The test circuit TC may control voltages applied to the upper pads 133 of the first memory die 130 by the control of the control signal. For example, the test circuit TC may be configured to cause predetermined voltages to be applied to different upper pads 133 of the first memory die 130 based on the control signal. Other test circuits TC described herein may be configured similarly with respect to the device on or in which they are included. As a voltage is applied to the upper pads 133 of the first memory die 130, an electrical field may be emitted from the upper pads 133.

The sensor 180 is configured to detect an electrical field emitted from the upper pads 133 of the first memory die 130. The sensor 180 is configured to output an electrical signal or an optical signal including information on the electrical field waveform based on the electrical field.

The signal processing device 190 is configured to determine whether the semiconductor package 100A is defective by using a signal output from the sensor 180. For example, in certain embodiments, the signal processing device 190 is configured to determine whether the semiconductor package 100A is defective based on an electrical field distribution and an electrical field waveform, which are the criteria for determining whether the semiconductor package 100A to be tested is defective.

For example, in one embodiment, the circuit control device 170 is configured to control the test circuit TC to emit an electrical field from all the upper pads 133 of the first memory die 130. The signal processing device 190 is configured to calculate electrical field waveforms for respective positions of the upper pads 133 (e.g., positions in relation to the set of upper pads 133, which may be arranged in at least two horizontal directions), based on an electrical signal or an optical signal output from the sensor 180. The signal processing device 190 is configured to determine whether the semiconductor package 100A is defective based on the electrical field waveform for each position. For example, the signal processing device 190 may compare the electrical field waveform for each position with a reference value, determine whether the upper pads 133 are defective according to the comparison result, and determine whether the semiconductor package 100A is defective, based on whether at least one of the upper pads 133 is defective (e.g., depending on a number of defective upper pads, or which upper pads are defective—in one case if any upper pad 133 is defective, the signal processing device 190 determines that the semiconductor package 100A is defective).

The reference value may refer to an electrical field waveform as a reference for determining whether a semiconductor package is defective. The reference value may include a magnitude of a reference electrical field (hereinafter, referred to as a 'reference magnitude') and a phase of a reference electrical field (hereinafter, referred to as a 'reference phase'). The reference value may be a value determined in units of a semiconductor package to be tested, or may be a value determined in units of upper pads included in a semiconductor package. For example, a reference value at a certain location above the semiconductor package may represent the expected waveform for an entire semiconductor package—if the expected waveform matches the actual waveform, the semiconductor package may be determined to be non-defective. In addition, a reference value at a specific location of an upper pad may represent the expected waveform at that location for that pad—if the expected waveform matches the actual waveform, specific pad may be determined to be non-defective.

In one embodiment, when the electrical field waveform of at least a set (e.g., one or more) of the upper pads 133 is different from the reference value, the signal processing device 190 determines that the semiconductor package 100A is defective. For example, when the magnitude of the electrical field of at least a set (e.g., one or more) of the upper pads 133 is smaller than the reference magnitude, or when the phase of the electrical field of at least a set (e.g., one or more) of the upper pads 133 is different from the reference phase, the signal processing device 190 may determine that the semiconductor package 100A is defective. The determination may be based on a certain minimum number (e.g., 1, 2, 5, etc.) of the upper pads 133 having a different electric field magnitude or different electric field phase from a reference. More specifically, in one embodiment, when the magnitude of the electrical field of at least a set of the upper pads 133 is smaller than the reference magnitude and the phase of the electrical field of at least a portion of the upper pads 133 is different from the reference phase, the signal processing device 190 may determine that the semiconductor package 100A is defective. The determination may be based on a certain minimum number (e.g., 1, 2, 5, etc.) of the upper pads 133 having a smaller electric field magnitude or different electric field phase from a reference.

According to an example embodiment, the circuit control device 170 may control the test circuit TC to emit an electrical field from the upper pads 133 corresponding to a specific pattern among the upper pads 133 of the first memory die 130. For example, the circuit control device 170 may control the frequency of the control signal transmitted to the test circuit TC or may transmit the control signal at a predetermined time difference. Accordingly, some upper pads among the upper pads 133 of the first memory die 130 may emit an electrical field, and the remaining upper pads may not emit an electrical field.

The signal processing device 190 may calculate the electrical field waveform at each position of each upper pad 133 based on the electrical signal or the optical signal output from the sensor 180. The signal processing device 190 may determine whether the semiconductor package 100A is defective based on the electrical field waveform for each position. In some embodiments, the test circuit TC causes emission of an electrical field from the upper pads 133 corresponding to different specific patterns among the upper pads 133 of the first memory die 130. Each specific pattern has a corresponding expected reference electric field waveform. For each pattern, the actual electric field waveform detected by the sensor 180 is compared to the expected reference electric field waveform, to determine if any of the upper pads 133 for that pattern are defective. In one embodiment, when the electrical field waveform of at least a set of the upper pads 133 corresponding to a specific pattern is different from an expected reference value, the signal processing device 190 may determine that the semiconductor package 100A is in a bad state. In addition, when an electrical field is detected from an upper pad 133 that does not correspond to any stored specific pattern, the signal processing device 190 may determine that the semiconductor package 100A is defective.

Referring to FIG. 5, when the semiconductor test device in FIG. 4 determines that the semiconductor package 100A is normal during the assembly of the semiconductor package 100A, the second memory die 140 may be stacked on the first memory die 130. The second memory die 140 may include second microbumps 141, a plurality of second TSVs 142, and upper pads 143.

When the second memory die 140 is stacked on the first memory die 130, poor contact between the upper pads 133 of the first memory die 130 and the second microbumps 141 of the second memory die 140 may occur. The semiconductor test device may determine contact failure between the upper pads 133 of the first memory die 130 and the second microbumps 141 of the second memory die 140. Therefore, the semiconductor test device may determine whether the semiconductor package 100B is defective without physical contact of the upper pads 143 of the second memory die 140 during assembly of the semiconductor package 100B.

An operation of determining whether the semiconductor package 100B is defective by the semiconductor test device of FIG. 5 may be the same as or similar to the operation of determining whether the semiconductor package 100A is defective by the semiconductor test device of FIG. 4.

Referring to FIG. 6, when the semiconductor test device determines that the semiconductor package 100B is normal (e.g., non-defective) during assembly of the semiconductor package 100B in FIG. 5, the plurality of microbumps 110 may be formed on the lower pads 125 of the base die 120. When the semiconductor package 100C is completed, only the plurality of microbumps 110 may be exposed externally, and thus, whether the completed semiconductor package 100C is defective may be determined using the plurality of microbumps 110.

The semiconductor test device may include a circuit control device 500, a sensor 600, and a signal processing device 700. The structure and operation of the semiconductor test device of FIG. 6 may be the same as or similar to the structure and operation of the semiconductor test device of FIG. 5.

Each of the microbumps 110 may include a pillar 111 and a solder layer 112. A plurality of microbumps 110 may be formed on the lower pads 125 of the base die 120. For example, the pillar 111 may be formed on the lower pads 125. An interface layer may be formed on the pillar 111. A solder layer 112 may be formed on the interface layer. The pillar 111, the interface layer, and the solder layer 112 may be formed of different metals.

The base die 120 may include a test pad 121, a circuit region 123, a wiring layer 124, and lower pads 125.

The wiring layer 124 may include a first metal pattern 127-1, a second metal pattern 127-2, a first via 128-1, a second via 128-2, and a passivation layer 129. The first metal pattern 127-1, the second metal pattern 127-2, the first via 128-1, and the second via 128-2 may be covered by the passivation layer 129.

The first metal pattern 127-1 and the second metal pattern 127-2 may transmit signals in a first direction (e.g., the X direction) parallel to the circuit region 123 in different layers.

The first via 128-1 may be connected between the test pad 121 and the first metal pattern 127-1 or between the lower pads 125 and the first metal pattern 127-1. The first via 128-1 may connect the test pad 121 and the first metal pattern 127-1 or the lower pads 125 and the first metal pattern 127-1 in the second direction (for example, the Y direction) perpendicular to the circuit region 123.

The second via 128-2 may be connected between the first metal pattern 127-1 and the second metal pattern 333. The second via 128-2 may connect the first metal pattern 127-1 and the second metal pattern 333 in the second direction. The first via 128-1 and the second via 128-2 may transmit a signal in the second direction.

When the plurality of microbumps 110 are formed on the lower pads 125 of the base die 120, the semiconductor test device may determine whether the semiconductor package 100c is defective without physical contact with the plurality of microbumps 110.

In a first embodiment, the semiconductor test device may determine a poor contact between the pillar 111 and the solder layer 112 of each of the microbumps 110.

In a second embodiment, the semiconductor test device may determine a poor contact between the plurality of microbumps 110 and the lower pads 125 of the base die 120.

In a third embodiment, the semiconductor test device may determine a poor contact between the lower pads 125 and the first via 128-1.

The semiconductor test device may determine whether the semiconductor package 100C is defective by using a test circuit TC included in the semiconductor package 100C, based on whether a signal is properly transmitted through the wiring circuit in the wiring layer 124. The test circuit TC may be considered to be part of the semiconductor test device. For example, the semiconductor test device may determine whether the semiconductor package 100C is defective in only the first direction (e.g., the X direction)

parallel to the circuit region 123 (e.g., based on an unintended short circuit, open circuit, or weak connection for a component that extends in the X direction).

In the semiconductor test device according to an example embodiment of the present inventive concept, a poor contact between the pillar 111 and the solder layer 112, a poor contact between the plurality of microbumps 110 and the lower pads 125 of the base die 120, and a poor contact between the lower pads 125 and the first via 128-1, may be further determined. For example, the semiconductor test device according to an example embodiment of the present inventive concept may also determine whether the semiconductor package 100C is defective in a second direction (e.g., the Y direction) perpendicular to the circuit region 123 (e.g., based on an unintended short circuit, open circuit, or weak connection for one or more components that extend and/or connect in the Y direction). In some embodiments, different waveforms will be emitted based on whether a defect in the X direction or a defect in the Y direction exists, and depending on a comparison between the actual waveform emitted, and predetermined waveforms that correspond to X direction or Y direction defects, such defects can be determined.

In detail, the sensor 600 may be disposed on the plurality of microbumps 110. For example, the sensor 600 may be disposed to be spaced apart therefrom on the upper surface of the plurality of microbumps 110.

The circuit control device 170 may transmit a control signal to the test circuit TC through the test pad 121. The test circuit TC may be activated by the control signal. The test circuit TC may control voltages applied to the microbumps 110 by the control of the control signal. As the voltage is applied to the plurality of microbumps 110, an electrical field may be emitted from the plurality of microbumps 110.

The sensor 600 may detect an electrical field emitted from the plurality of microbumps 110. The sensor 600 may output an electrical signal or an optical signal including information on the electrical field waveform, based on the electrical field.

The signal processing device 700 may determine whether the semiconductor package 100C is defective by using a signal output from the sensor 600. The signal processing device 700 may determine whether the semiconductor package 100C is defective based on an electrical field distribution and an electrical field waveform, which are the criteria for determining whether the semiconductor package 100C to be tested is defective.

For example, the circuit control device 500 may control the test circuit TC to emit an electrical field from all the microbumps 110 of the semiconductor package 100C. The signal processing device 700 may calculate the electrical field waveform at each position of each microbump 110 based on the signal output from the sensor 600. The signal processing device 700 may determine whether the semiconductor package 100A is defective based on the electrical field waveform for each position. For example, the signal processing device 700 may compare the electrical field waveform for each position with a reference value, determine whether the microbumps 110 are defective according to the comparison result, and may determine whether the semiconductor package 100A is defective based on whether at least one of the microbumps 110 is defective. When the electrical field waveform of at least a portion (e.g., one or more) of the microbumps 110 is different from the reference value, the signal processing device 700 may determine that the semiconductor package 100C is defective.

According to an example embodiment, the circuit control device 500 controls the test circuit TC to emit an electrical field from the microbumps 110 corresponding to a specific pattern among the microbumps 110 of the semiconductor package 100C. The signal processing device 700 may calculate the electrical field waveform at each position of each microbump 110 based on the signal output from the sensor 600. The signal processing device 700 may determine whether the semiconductor package 100A is defective based on the electrical field waveform for each position. For example, when the electrical field waveform of at least a portion (e.g., one or more) of the microbumps 110 corresponding to a specific pattern is different from the reference value, the signal processing device 700 may determine that the semiconductor package 100C is defective. Alternatively, when an electrical field is detected from a microbump 110 that does not correspond to one of the microbumps of the specific pattern, the signal processing device 700 may determine that the semiconductor package 100C is in a bad state.

Figure 7:
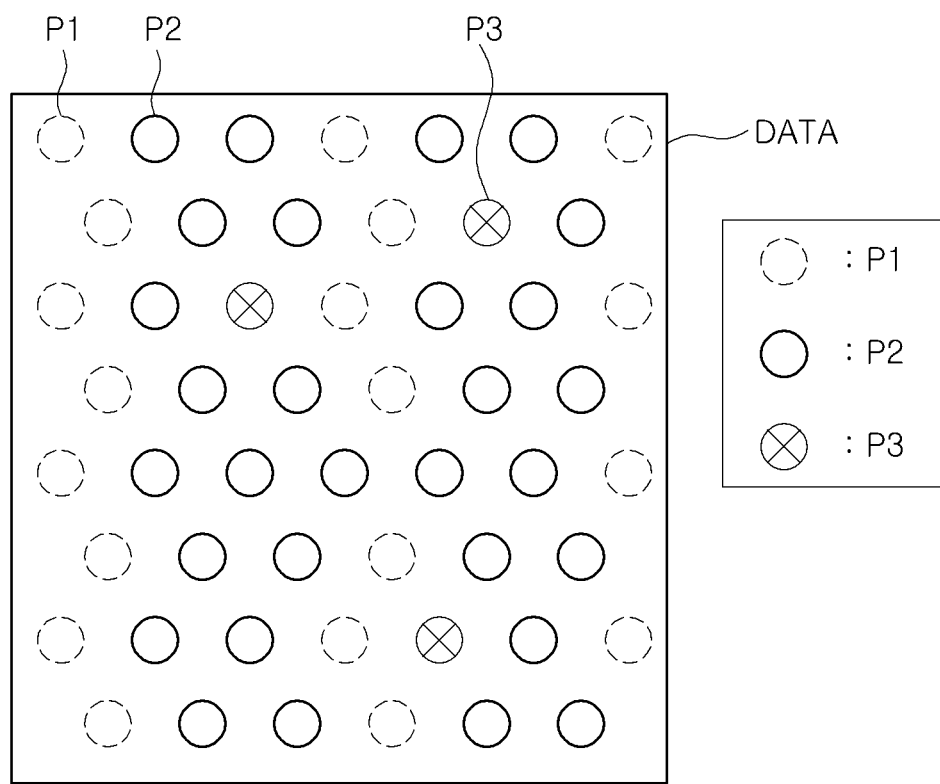
FIG. 7 is a drawing illustrating an operation of a signal processing device according to an example embodiment.

FIG. 7 is a drawing illustrating the operation of the signal processing device according to an example embodiment.

Referring to FIGS. 6 and 7, the semiconductor package 100C may receive design data from an external source. The design data of the semiconductor package 100C may include a plurality of pins. First pins P1 among the plurality of pins may be pins for transmitting a power supply voltage or a ground voltage. Second pins P2 among the plurality of pins may be input/output pins for transmitting a signal. Each of the plurality of pins included in the design data of the semiconductor package 100C may correspond to each of the plurality of microbumps 110 of the semiconductor package 100C.

Since the first pins P1 are electrically connected to each other, even if any one of the first pins P1 is determined to be defective, the defective pin may be replaced with another one of the first pins P1. However, if any one of the second pins P2 is determined to be defective, the pin determined as defective may not transmit a signal.

Therefore, the semiconductor test device may test the second pins P2. Third pins P3 of the plurality of pins may be bad pins that are determined to be bad among the second pins P2.

The signal processing device 700 may be configured to calculate the electrical field waveform at each position for each microbump 110 using the signal output from the sensor 600. The signal processing device 700 may be configured to generate an image indicating the location of the microbump determined to be defective by using the electrical field waveform for each location. The signal processing device 700 may be configured to match the image with the design data of the semiconductor package 100C. The signal processing device 700 may be configured to determine the position information of a pin matched with a microbump determined as being defective among the pins included in the design data. Therefore, the signal processing device 700 may accurately output the position of the microbump determined as being defective in the semiconductor package 100C.

Figure 8:
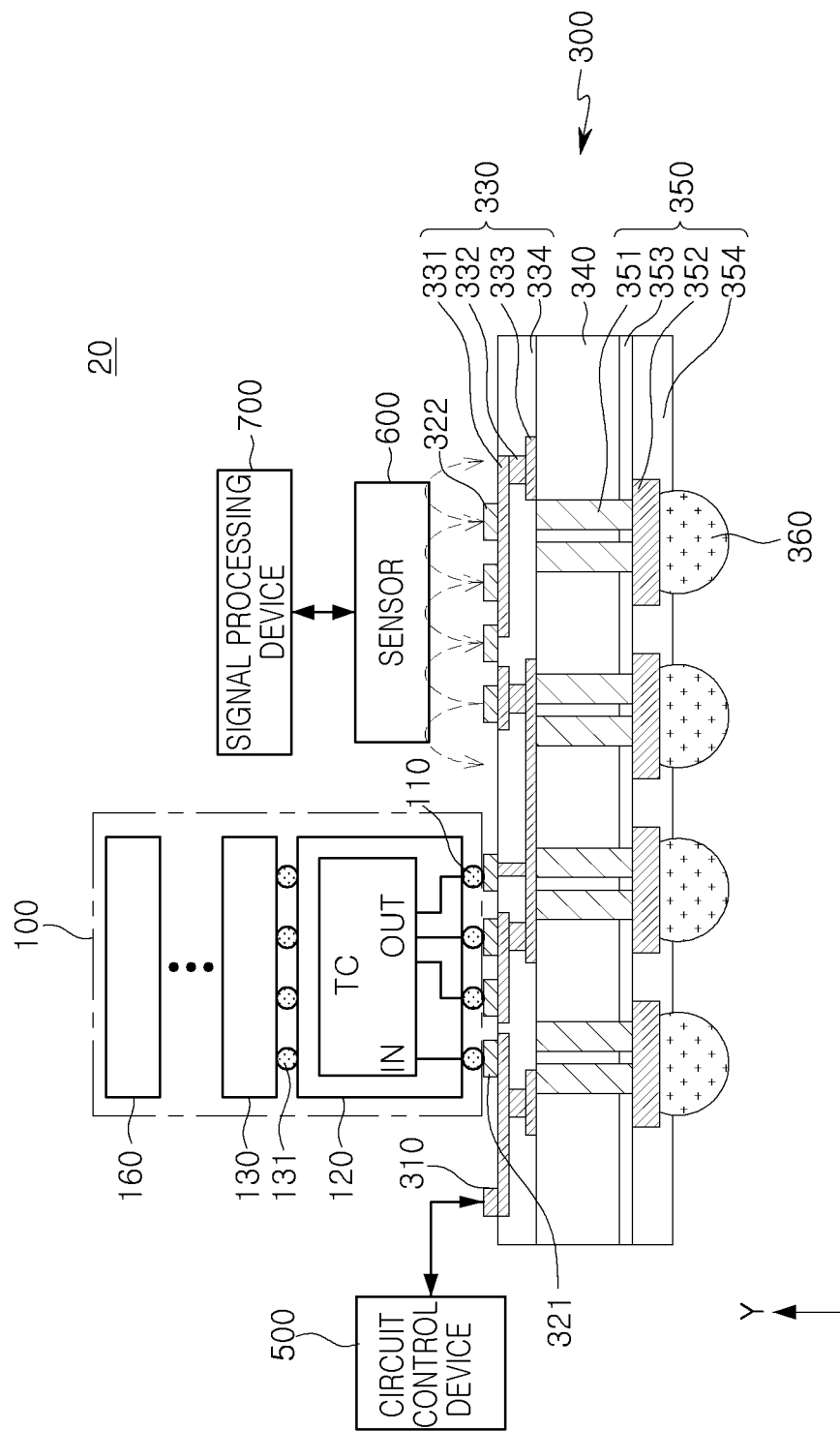
FIGS. 8 to 10 are diagrams illustrating an operation of testing a semiconductor device by a semiconductor test device according to an example embodiment.
Figure 9:
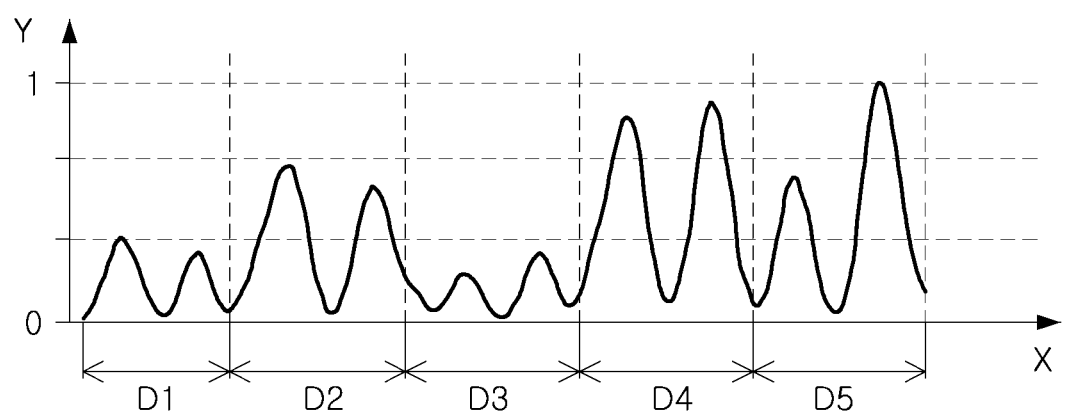
Figure 10:
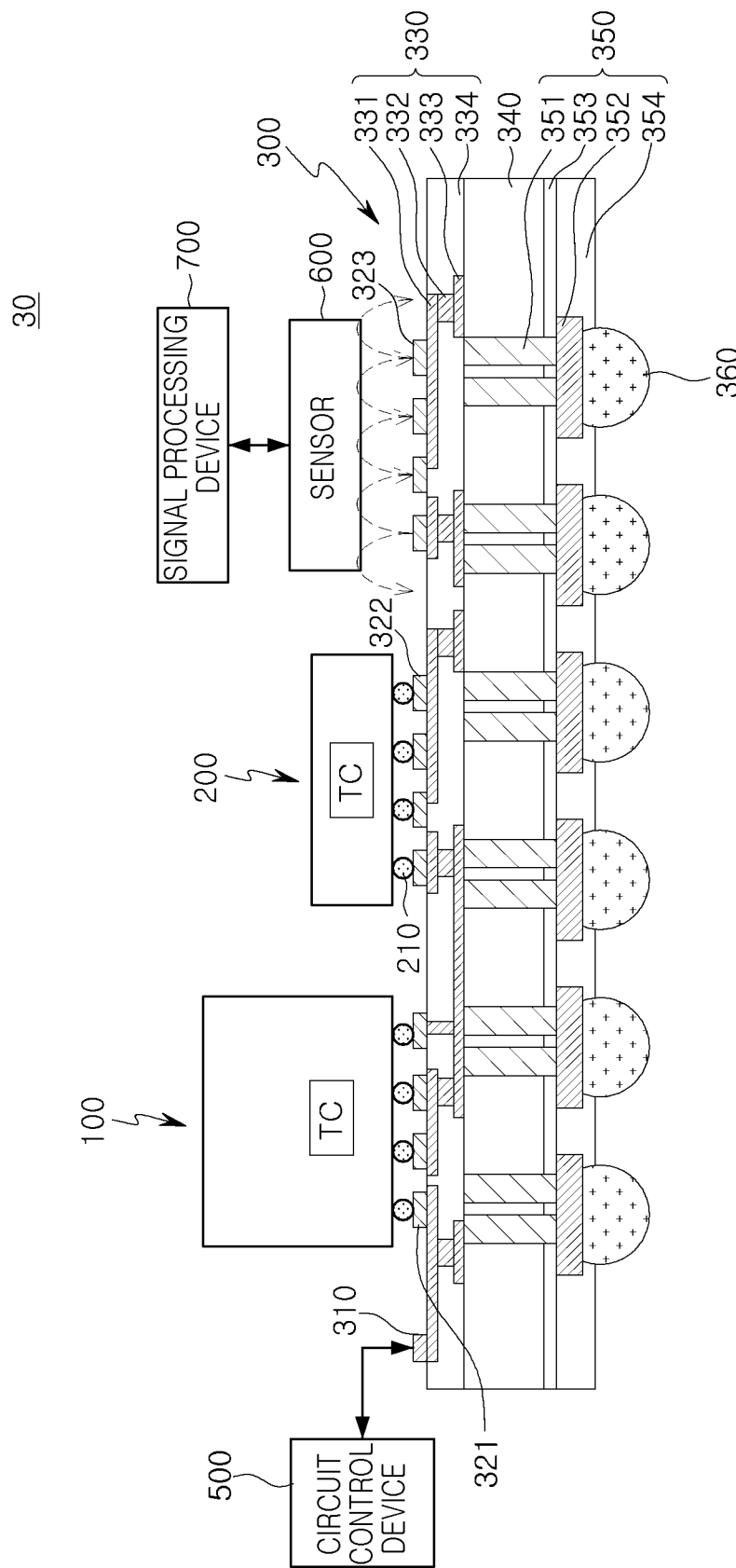

FIGS. 8 to 10 are diagrams illustrating an operation of testing a semiconductor device by a semiconductor test device according to an example embodiment. FIGS. 8 to 10 are diagrams illustrating an operation of determining a defect of a semiconductor device 20 without physical contact of a pad for each semiconductor package included in the semiconductor device 20 during assembly of the semiconductor device 20.

First, referring to FIG. 8, when it is determined that respective wiring connections of a first semiconductor package 100 and a wiring circuit board 300 are normal, the first semiconductor package 100 may be stacked on the wiring circuit board 300. Through the coupling of a plurality of bumps 110 of the first semiconductor package 100 and first upper pads 321 of a first area of the wiring circuit board 300, the first semiconductor package 100 may be stacked on the wiring circuit board 300.

When the first semiconductor package 100 is stacked on the wiring circuit board 300, the semiconductor test device may determine whether the semiconductor device 20 is defective without physical contact of second upper pads 322 in a second area of the wiring circuit board 300.

In a first embodiment, the semiconductor test device may determine a contact failure between the first upper pads 321 of the wiring circuit board 300 and the plurality of bumps 110 of the first semiconductor package 100. Therefore, the semiconductor test device may determine whether the semiconductor device 20 is defective in a second direction (e.g., the Y direction) perpendicular to a substrate 340.

In a second embodiment, the semiconductor test device may determine a defect of a wiring circuit inside the wiring circuit board 300 (e.g., a wiring circuit that extends in the first direction, such as the X or Z direction). Therefore, the semiconductor test device may determine whether the semiconductor device 20 is defective in a first direction (e.g., the X or Z direction) parallel to the substrate 340.

In detail, a sensor 600 may be disposed above the second upper pads 322. For example, the sensor 600 may be disposed to be spaced apart therefrom on the upper surfaces of the second upper pads 322.

A circuit control device 500 may transmit a control signal to a test circuit TC included in the first semiconductor package 100 through a test pad 310. For example, the test pad 310 may connect to a wire connected to the circuit control device 500. The test circuit TC may be activated by a control signal. The test circuit TC may be considered to be part of the semiconductor test device. The test circuit TC may control voltages applied to second upper pads 322 according to the control of the control signal. As the voltage is applied to the second upper pads 322, an electrical field may be emitted from the second upper pads 322.

The sensor 600 may detect an electrical field emitted from the second upper pads 322. The sensor 600 may output an electrical signal or an optical signal including information on the electrical field waveform based on the electrical field.

A signal processing device 700 may determine whether the semiconductor device 20 is defective during assembly of the semiconductor device 20 by using a signal output from the sensor 600. The signal processing device 700 may determine whether the semiconductor device 20 is defective, based on an electrical field distribution and an electrical field waveform, which are criteria for determining whether the semiconductor device 20 to be tested is defective.

For example, the circuit control device 500 may control the test circuit TC to emit an electrical field from all the second upper pads 322 of the second area of the wiring circuit board 300. The signal processing device 700 may calculate the electrical field waveform at each position for each second upper pad 322 of the second area, based on the signal output from the sensor 600. The signal processing device 700 may determine whether the semiconductor device 20 is defective based on the electrical field waveform for each position. For example, in one embodiment, the signal processing device 700 compares the electrical field waveform for each position with a reference value, determines whether the second upper pads 322 of the second area are defective by the comparison result, and determines whether the semiconductor device 20 is defective, based on whether at least one of the upper pads 322 of the second area is defective. When the electrical field waveform of at least a portion (e.g., at least one, or at least a predetermined number) of the second upper pads 322 in the second area is different from the reference value, the signal processing device 700 may determine that the semiconductor device 20 is defective.

According to an example embodiment, the circuit control device 500 may control the test circuit TC to emit an electrical field from the second upper pads 322 corresponding to a specific pattern among the second upper pads 322 of the second area of the wiring circuit board 300. The signal processing device 700 may calculate the electrical field waveform at each position for each second upper pad 322 of the second area, based on a signal output from the sensor 600. The signal processing device 700 may determine whether the semiconductor device 20 is defective, based on the electrical field waveform for each position. For example, when the electrical field waveform of at least a portion (e.g., at least one, or at least a predetermined number) of the second upper pads 322 corresponding to a specific pattern is different from the reference value, the signal processing device 700 may determine that the semiconductor device 20 is defective. Alternatively, when an electrical field is detected from the second upper pad 322 that does not correspond to a specific pattern, the signal processing device 700 may determine that the semiconductor device 20 is defective.

FIG. 9 is a graph illustrating the relative magnitude of the electrical field for each position according to an example embodiment.

Referring to FIG. 9, the X-axis represents the positions of the second upper pads 322 of the wiring circuit board 300 by respective sections D1-D5, and the Y-axis represents the relative magnitude of the electrical field emitted from the second upper pads 322 of the wiring circuit board 300.

In the second section D2, the fourth section D4 and the fifth section D5, the magnitude of the electrical field emitted from the second upper pads 322 of the wiring circuit board 300 may be relatively large. Accordingly, it may be determined that contact between the pad and the bump corresponding to the position of the second section D2, the fourth section D4 and the fifth section D5 is normal.

In the first section D1 and the third section D3, the magnitude of the electrical field emitted from the second upper pads 322 of the wiring circuit board 300 may be relatively small. Therefore, it may be determined that the contact between the pad and the bump corresponding to the position of the first section D1 and the third section D3 is poor. It should be noted that the sections D1-D5 may each correspond to a single pad. Alternatively, the sections D1-D5 may correspond to a group of pads at a particular region and whose collective expected electric field waveform is known. A mismatch in the waveform for the particular region may indicate that at least one circuit corresponding to the region has a poor connection.

Referring to FIG. 10, when the semiconductor test device determines that the semiconductor device 20 is normal during assembly of the semiconductor device 20 in FIG. 8, a second semiconductor package 200 may be stacked on a wiring circuit board 300.

Through the coupling of a plurality of bumps 210 of the second semiconductor package 200 and second upper pads 322 in a second area of the wiring circuit board 300, the second semiconductor package 200 may be stacked on the wiring circuit board 300.

When the second semiconductor package 200 is stacked on the wiring circuit board 300, the semiconductor test device may determine whether the semiconductor device is defective without physical contact of third upper pads 323 of a third area of the wiring circuit board 300.

In a first embodiment, the semiconductor test device may determine a contact failure between the second upper pads 322 of the wiring circuit board 300 and a plurality of bumps 210 of the second semiconductor package 200. Therefore, the semiconductor test device may determine whether a semiconductor device 30 is defective in a second direction (e.g., the Y direction) perpendicular to a substrate 340.

In a second embodiment, the semiconductor test device may determine a defect of a wiring circuit inside the wiring circuit board 300. Therefore, the semiconductor test device may determine whether a semiconductor device 30 is defective in a first direction (e.g., the X direction) parallel to the substrate 340.

The sensor 600 may be disposed above the third upper pads 323. For example, the sensor 600 may be disposed above the upper surfaces of the third upper pads 323 to be spaced apart therefrom by a predetermined interval.

The circuit control device 500 may transmit a control signal to the test circuit TC included in the second semiconductor package 200 through the test pad 310. The test circuit TC may be activated by a control signal. The test circuit TC may control voltages applied to the third upper pads 323 by the control of the control signal. As the voltage is applied to the third upper pads 323, an electrical field may be emitted from the third upper pads 323.

The sensor 600 may detect an electrical field emitted from the third upper pads 323. The sensor 600 may output an electrical signal or an optical signal including information on the electrical field waveform, based on the electrical field.

The signal processing device 700 may determine whether the semiconductor device 30 is defective during assembly of the semiconductor device 30 using the signal output from the sensor 600.

The signal processing device 700 may determine whether the semiconductor device 30 is defective, based on an electrical field distribution and an electrical field waveform. The electrical field distribution and the electrical field waveform are the criteria for determining whether the semiconductor device 30 under test is defective.

For example, the circuit control device 500 may control the test circuit TC to emit an electrical field from all the third upper pads 323 of the third area of the wiring circuit board 300. The signal processing device 700 may calculate the electrical field waveform at each position for each third upper pad 323 of the third area, based on the signal output from the sensor 600. The signal processing device 700 may determine whether the semiconductor device 30 is defective, based on the electrical field waveform for each position. For example, the signal processing device 700 compares the electrical field waveform for each position with a reference value, determines whether the third upper pads 323 of the third area are defective according to the comparison result, and determines whether the semiconductor device 30 is defective based on whether at least one of the third upper pads 323 of the third area is defective. When the electrical field waveform of at least a portion (e.g., at least one, or at least a predetermined number) of the third upper pads 323 of the third area is different from the reference value, the signal processing device 700 may determine that the semiconductor device 30 is defective.

According to an example embodiment, the circuit control device 500 may control the test circuit TC to emit an electrical field from the second upper pads 323 corresponding to a specific pattern among the second upper pads 323 of the third area of the wiring circuit board 300. The signal processing device 700 may calculate the electrical field waveform at each position for each third upper pad 323 of the third area, based on the signal output from the sensor 600. The signal processing device 700 may determine whether the semiconductor device 30 is defective based on the electrical field waveform for each position. For example, when the electrical field waveform of at least a portion (e.g., at least one, or at least a predetermined number) of the second upper pads 323 corresponding to a specific pattern is different from the reference value, the signal processing device 700 may determine that the semiconductor device 20 is defective. Alternatively, when an electrical field is detected from the second upper pad 323 that does not correspond to a specific pattern, the signal processing device 700 may determine that the semiconductor device 20 is defective.

Figure 11:
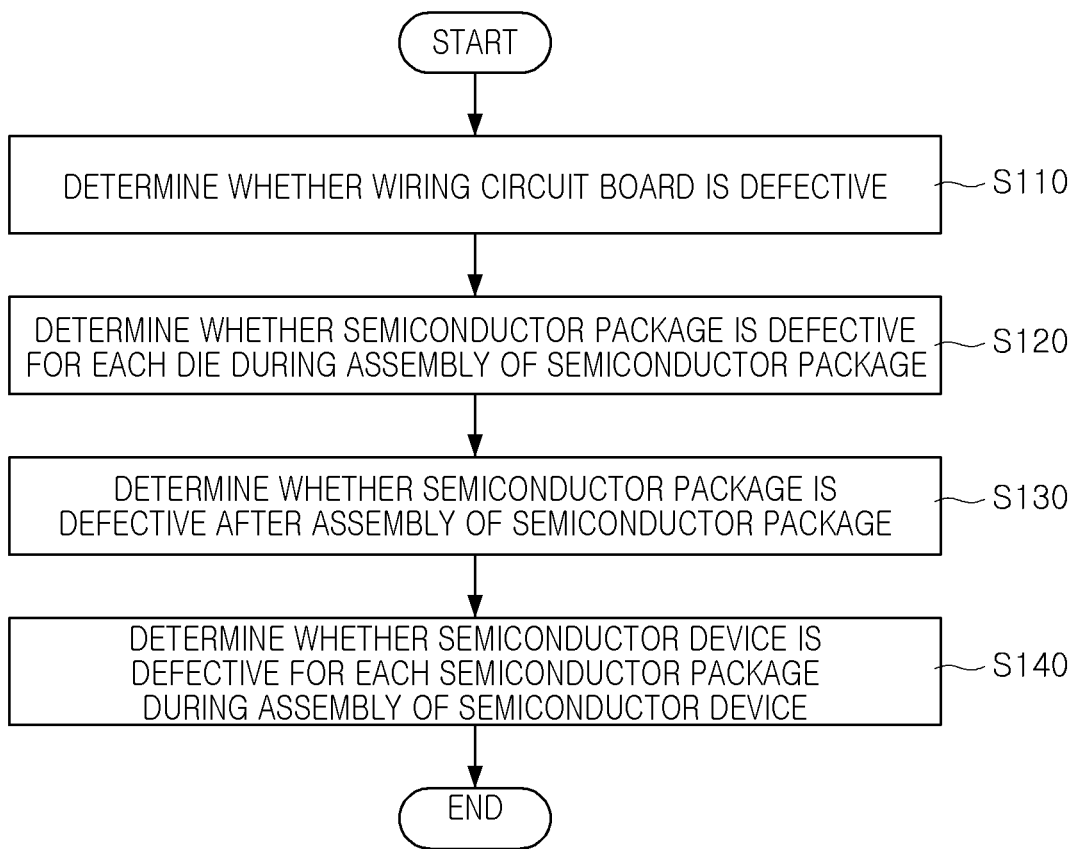
FIG. 11 is a flowchart illustrating a test method of a semiconductor device according to an example embodiment.

FIG. 11 is a flowchart illustrating a test method of a semiconductor device according to example embodiments.

Referring to FIG. 11, a semiconductor test device may determine whether a wiring circuit board is defective (S110). The semiconductor test device may measure an electrical field signal generated by the upper pads of the wiring circuit board without physical contact with the upper pads.

The semiconductor test device may determine whether the semiconductor package is defective during assembly of the semiconductor package, without physical contact of pads, for each die included in the semiconductor package (S120). For example, the semiconductor test device may determine a poor contact between the upper pads of the base die and the microbumps of the first memory die when the first memory die is stacked on the base die. According to an example embodiment, when the second memory die is stacked on the first memory die, the semiconductor test device may determine contact failure between the upper pads of the first memory die and the microbumps of the second memory die.

The semiconductor test device according to an example embodiment may determine whether the semiconductor package is defective without physically touching the pad by using a test circuit embedded in the semiconductor chip during assembly of the semiconductor package. Therefore, defective components may be detected early during assembly of the semiconductor package. In addition, costs may be reduced by detecting defective components early.

The semiconductor test device may determine whether the semiconductor package is defective after assembly of the semiconductor package without physical contact of bumps of the semiconductor package (S130). In a first embodiment, the semiconductor test device may determine a poor contact between a pillar and a solder layer of each of the microbumps of the semiconductor package. In a second embodiment, the semiconductor test device may determine a poor contact between microbumps of a semiconductor package and lower pads of a base die. In a third embodiment, the semiconductor test device may determine a poor contact between the lower pads of the base die and the via of the base die. For example, a poor contact between a pillar and a solder layer of each of the microbumps of the semiconductor package may result in a first waveform having first characteristics. A poor contact between microbumps of a semiconductor package and lower pads of a base die may result in a second waveform having second characteristics different from the first characteristics. A poor contact between the lower pads of the base die and the via of the base die may result in a third waveform having third characteristics different from the first and second characteristics.

The semiconductor test device according to an example embodiment may test a contact failure of components that could not be tested by a contact method. Therefore, product reliability and customer satisfaction may be further improved.

During the assembly of the semiconductor device, the semiconductor test device may test whether the semiconductor device is defective without physically touching the pad for each semiconductor package included in the semiconductor device (S140). For example, when the first semiconductor package is stacked on the wiring circuit board, the semiconductor test device may determine contact failure between the upper pads of the wiring circuit board and the bumps of the first semiconductor package. After the first semiconductor package is stacked on the wiring circuit board, when the second semiconductor package is stacked on the wiring circuit board, the semiconductor test device detects a poor contact between the upper pads of the wiring circuit board and the bumps of the second semiconductor package.

The semiconductor test device according to an example embodiment may determine whether the semiconductor device is defective without physically touching the pad by using a test circuit embedded in the semiconductor chip during assembly of the semiconductor device. Therefore, defective components may be detected early during assembly of the semiconductor device.

As set forth above, according to an example embodiment, since a semiconductor test device may test contact failure of components included in a semiconductor device using a test circuit embedded in a semiconductor chip, the semiconductor test device may detect defective components early during assembly of the semiconductor device. In addition, since the semiconductor test device may measure an electrical field signal on a wiring without physical contact with a bump or a pad, it is possible to test defects of components that may not be capable of testing by a contact method. In addition, since there is no damage to the product due to the test, the test may be performed in a mass production process, and thus, the entire inspection of the products may be carried out. Therefore, product reliability and customer satisfaction may be further improved.

It should be noted that certain components, such as pads or microbumps, may be described herein and in the claims as a "set" or "group" in order to differentiate different groups or sets of components from others. Each set or group may include one or more such components.

While example embodiments have been illustrated and described above, it will be apparent to those skilled in the art that modifications and variations could be made without departing from the scope of the present invention as defined by the appended claims.

What is claimed is:

1. A method using a semiconductor test device for testing a semiconductor package including a semiconductor chip, the method comprising:
   receiving a control signal through a test pad from an external circuit control device;
   controlling a test circuit embedded in the semiconductor chip according to the control signal, to cause emission of an electric field from at least a set of microbumps among microbumps connected to the semiconductor package;
   using a sensor disposed above an upper surface of the microbumps and spaced apart therefrom by a predetermined interval, to detect the electric field emitted from one or more microbumps of the set of microbumps and to output a signal including information about one or more electric field waveforms; and
   using the signal output from the sensor by a signal processing device to determine whether the semiconductor package is defective,
   wherein the set of microbumps are bumps for connecting the semiconductor package to an external package substrate.

2. The method of claim 1, wherein the external circuit control device controls the test circuit to cause emission of the electric field from the set of microbumps, and the set of microbumps includes all microbumps for connecting the semiconductor package to an external package substrate, and
   the signal processing device calculates an electric field waveform at a position of each microbump of the set of microbumps, based on the signal output from the sensor, and determines whether the semiconductor package is defective, based on the electric field waveform of each position.

3. The method of claim 1, wherein the external circuit control device controls the test circuit to cause emission of the electric field from the set of microbumps, which correspond to a specific pattern from among the microbumps for connecting the semiconductor package to the external package substrate, and
   the signal processing device calculates an electric field waveform at a position of each of the microbumps of the set of microbumps, based on the signal output from the sensor, and determines whether the semiconductor package is defective based on the electric field waveform of each position.

4. The method of claim 1, wherein each of the microbumps of the set of microbumps comprises a pillar and a solder layer stacked on the pillar,
   wherein the semiconductor test device determines a contact failure between the pillar and the solder layer of each of the microbumps of the set of microbumps.

5. The method of claim 1, wherein a group of the microbumps connected to the semiconductor package are disposed on lower pads disposed on the semiconductor chip, and the semiconductor test device determines a contact failure between the microbumps and the lower pads.

6. The method of claim 1, wherein a group of the microbumps connected to the semiconductor package are disposed on lower pads disposed on the semiconductor chip, and the semiconductor test device determines a contact failure between the lower pads and vias connected to the lower pads.

7. The method of claim 1, wherein the signal processing device calculates an electric field waveform at a position of each of the microbumps connected to the semiconductor package using the signal output from the sensor, and generates an image for identifying a position of a microbump determined as being defective using the electric field waveform for each position, and,
   the semiconductor test device determines whether the semiconductor package is defective, based on whether at least one of the microbumps connected to the semiconductor package is defective.

8. The method of claim 7, wherein the signal processing device receives design data corresponding to each of the microbumps of the semiconductor package, and outputs position information of microbumps, determined to be defective, by matching the image and the design data.

9. The method of claim 1, wherein the signal processing device determines whether the semiconductor package is defective, based on electric field distribution and an electric field waveform serving as a criterion for determining whether the semiconductor package is defective.

10. The method of claim 1, wherein when the sensor is a sensor using an electro-optic crystal, the sensor detects the electric field, using a refractive index that varies according to a waveform of the electric field.

11. The method of claim 1, wherein the semiconductor chip is a base die in the semiconductor package, and the semiconductor package includes one or more additional semiconductor chips disposed below the base die during the emission of the electric field from at least the set of microbumps, so that the base die is between the microbumps and the one or more additional semiconductor chips.

12. The method of claim 11, wherein controlling the test circuit includes inputting a test signal to a test pad of the base die.

13. A method using a semiconductor test device for testing a semiconductor package including a base die and one or more semiconductor chips formed thereon, the method comprising:

controlling a test circuit embedded in the base die to cause emission of an electric field from at least a set of microbumps among microbumps connected to the base die, wherein the base die is disposed between the one or more semiconductor chips and the set of microbumps;

using a sensor disposed outside of an outer surface of the microbumps and facing the microbumps, and spaced apart from the microbumps by a predetermined interval, to detect the electric field emitted from one or more microbumps of the set of microbumps and to output a signal including information about an electric field waveform; and using the signal output from the sensor by a signal processing device to determine whether the semiconductor package is defective, wherein the set of microbumps are exposed externally with respect to the semiconductor package.

14. The method of claim 13, wherein the microbumps are bumps for connecting the semiconductor package to a wiring circuit board.

15. The method of claim 13, wherein controlling the test circuit includes inputting a test signal to a test pad of the base die from an external circuit control device.

* * * * *